United States Patent [19]

Dunham et al.

[11] 3,711,287

[45] Jan. 16, 1973

[54] PHOTORESIST COMPOSITIONS

[75] Inventors: Kenneth R. Dunham; Marshall E. Yost, both of Rochester, N.Y.

[73] Assignee: Eastman Kodak Company, Rochester, N.Y.

[22] Filed: May 19, 1971

[21] Appl. No.: 145,025

[52] U.S. Cl. ....................96/115 R

[51] Int. Cl. ....................G03c 1/68

[58] Field of Search....................96/35.1, 115, 48

[56] References Cited

UNITED STATES PATENTS

| | | | |
|---|---|---|---|
| 3,520,683 | 7/1970 | Kerwin | 96/35.1 |
| 3,495,987 | 2/1970 | Moore | 96/115 |
| 3,398,210 | 8/1968 | Plueddeman | 260/827 |
| 3,042,515 | 7/1962 | Wainer | 96/48 |

*Primary Examiner*—J. Travis Brown
*Assistant Examiner*—John L. Goodrow
*Attorney*—Robert W. Hampton, James R. Frederick and G. Levitt

[57] ABSTRACT

Novel rubbery photoresist compositions are described which include a hydroperoxide to improve adhesion of the resist to the substrate on which it is coated.

9 Claims, No Drawings

PHOTORESIST COMPOSITIONS

This invention relates to photoresists. In a particular aspect it relates to photoresist compositions having improved adhesion to the substrate on which they are carried and to elements bearing layers of such photoresist compositions.

It is well known to employ light sensitive polymers and polymer compositions in the preparation of photoresists on surfaces which are to be treated with etchants or other active solutions such as acids, plating baths, and the like. The developed resist protects the coated surfaces from the action of the active solution, which acts on the unprotected areas of the substrate. Most applications in which photoresists are used require good adhesion of the photoresist material to the support on which it is coated. Adhesion of the photoresist to the substrate becomes more significant as the activity of the etchant increases and as the size of the image decreases. In the case of microelectronic circuit preparation, for example, where relatively small images are reproduced, adhesion of the photoresist is critical in maintaining the desired high resolution and image quality. Since photoresist compositions based on light sensitive polymers and light sensitive polymer compositions have found wide acceptance for the preparation of microelectronic circuits, there has arisen increased interest in methods of improving the adhesion of such photoresist compositions to substrates in general, and, in particular to substrates which are employed in microelectronic work, such as silicon wafers.

A number of methods have been suggested to improve the adhesion of photoresist coatings to metals, metal oxides, and other surfaces on which photoresists are typically prepared. Precoating surface treatments, which will activate or clean the surface in a particular way, have been used to improve the bond formed between the surface and the coating. Such methods are generally designed for the particular surface involved and are not of general applicability. Any treatment to modify the surface before coating with a photoresist layer necessarily involves an extra step in the procedure, which is costly in both time and money. Then, too, some of the surface treatments may involve the use of toxic chemicals or require operation at elevated temperatures which either are hazardous or increase the costs of preparation.

Thus, there is a need for a simple and economic means for improving the degree of adhesion of photoresist compositions to substrates on which they are coated, and in particular to those substrates which require the use of extremely active etchants or on which relatively small resist images are generally formed, such as those substrates generally employed in the preparation of microelectronic circuits.

Photoresist compositions having improved adhesion are described in Dunham et al. copending U.S. application Ser. No. 111,121, filed Jan. 29, 1971, which incorporate in the photoresist composition a polar N-substituted imide such as an N-halocyclic imide. These addenda are particularly effective in improving adhesion of commercially available photoresist materials, such as those based on sensitized rubber and rubber-like materials and light sensitive polymers containing unsaturated acid esters. However, under the severe etching conditions contemplated for use with such photoresists and with the high resolution demanded of them, the adhesion requirements for the resist material are exceedingly high and any improvement in adhesion which can be obtained is extremely desirable. Accordingly, even though the photoresist materials exhibit adequate adhesion for most purposes, any further improvement in adhesion would be extremely desirable.

Accordingly, it is an object of this invention to provide novel photoresist compositions.

It is a further object of this invention to provide novel photoresist compositions having improved adhesion to a variety of substrates.

It is still a further object of this invention to provide improved photoresist compositions which will permit etching with extremely active etchants using relatively small resist images without premature failure of the resist image.

It is still another object of this invention to provide novel photosensitive elements in which the photoresist composition has improved adhesion to the substrate on which it is carried.

The above and other objects of this invention will become apparent to those skilled in the art from the further description of the invention which follows.

It is known that when certain rubbery materials are allowed to stand in the presence of air, hydroperoxides form on the rubber backbone. It has also been observed that when resists prepared from freshly made rubbery photoresist compositions are employed they often show poor adhesion; although when these same photoresist compositions are stored in the presence of air, air is absorbed into the resist composition, as evidenced by the presence of a vacuum in the bottles in which they have been stored, and, after one or two weeks of storage, an improvement in adhesion of resists prepared with these compositions is observed. We think that this improvement in adhesion is attributable to the formation of hydroperoxide on the rubbery material. However, such natural improvement is neither a sufficient nor a reliable method for providing an increase in adhesion. It is dependent upon the particular rubbery material employed, the length of storage, the amount of air present during storage, and other factors which are difficult to control. We have found that by adding certain organic hydroperoxides to rubbery photoresist compositions an improvement in adhesion of the resist composition to the substrate on which it is coated is obtained, even over compositions which contained aged rubbery material.

In accordance with the present invention we have found that an improvement in adhesion between the photoresist composition and the substrate can be obtained by adding organic hydroperoxides which are thermally stable at temperatures up to 100° C to photoresist compositions based on sensitized rubber and rubber-like materials, such as azide-sensitized rubbery materials which contain a polar N-substituted imide.

In preparing resists using photoresist compositions of the type employed in the present invention, prebake treatments at temperatures up to 100° C and above are often employed. Such prebake treatments are designed to remove residual solvent and improve adhesion of the resist coating to the substrate during development. It has been found that if hydroperoxides are employed which decompose during prebake, clean development of the resist image is not obtained and a residual scum is left in the unexposed areas. Therefore, the organic hydroperoxides employed in the present invention should be thermally stable at temperatures up to about 100° C so that they will not decompose during such prebake treatments. Although the useful peroxides may decompose at the typically higher temperatures employed with postbake treatments, this has not been found to adversely affect the resist performance. Typical of thermally stable organic hydroperoxides which can be employed in the present invention to improve adhesion of photoresist compositions are alkyl hydroperoxides, such as t-butyl hydroperoxide and aryl hydroperoxides, such as cumene hydroperoxide. Improvements in adhesion are obtained when the organic hydroperoxide is added to the rubbery resist composition in amounts up to 1 percent by weight, based on the weight of the rubbery component in the photoresist composition. Preferably, the organic hydroperoxide is employed in amount of 0.05 to 0.5 percent by weight.

The polar N-substituted imides which are most useful in the compositions of the present invention are described in the above mentioned Dunham et al U.S. application Ser. No. 111,121, and include N-halo cyclic imides such as N-bromo-succinimide, N-chlorosuccinimide, N-iodosuccinimide, N-bromo-glutarimide, N-chloroglutarimide, N-iodoglutarimide, N-bromo-phthalimide, N-chlorophthalimide, N-iodophthalimide, and the like. The preferred N-halo cyclic imides which are used with the coating compositions of the present invention can be represented by the structural formula

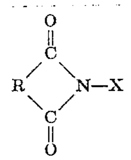

wherein X is a halogen atom such as a chlorine atom, a bromine atom or an iodide atom, and R is an alkylene group of two to eight carbon atoms such as ethylene, propylene, hexylene, octylene, etc., or an arylene group such as an o-phenylene group, including alkylene and arylene groups substituted with such groups as alkoxy groups, aryloxy groups, halo groups, nitro groups, and the like.

The amount of N-substituted imide added to the photoresist composition can vary widely. Useful results are obtained when the polar N-substituted imide is added to the photoresist composition in amounts of up to about 10 percent by weight based on the weight of the polymer present in the composition. This can constitute up to about 2.5 percent by weight of the coating composition. Preferably the polar N-halo cyclic imide is added to the photoresist composition in amount of about 0.5 to 3 percent by weight of the polymer.

With the compositions of the present invention an increase in adhesion to the substrate is obtained not only with substrates such as copper, zinc, steel, chromium, and the like, but a particular improvement in adhesion is obtained with substrates of such materials as silicon dioxide where adhesion has been a problem in the art and which are employed in micro-electronics work where high resolutions of detailed images is required.

Photosensitive elements of the present invention are prepared by incorporating an organic peroxide and an N-substituted imide into a light sensitive polymeric composition and coating the composition onto a support by conventional coating techniques such as whirl coating, flow coating, dip coating, spray coating, etc. In general, the selection of a light sensitive polymer composition, the solvent for its application, the support material to which it is applied, and the method of coating on the support depends upon the intended use of the resist image produced. As indicated above, the coating compositions of the present invention can be used with all of the supports on which resist coatings are generally made. This includes such supports as sheets and foils of such metals as copper, aluminum, steel, zinc, magnesium, etc., silicon dioxide chips and wafers, glass, glass coated with such metals as chromium, chromium alloys, nickel, steel, silver, gold, platinum, etc., and the like.

The polymeric photosensitive compositions which are modified in accordance with the present invention are sensitized rubber and rubber-like materials. Such compositions comprise a colloid which itself is not light sensitive but to which is added a sensitizer which makes the composition photosensitive by imparting to it the property of becoming insolubilized on exposure to visible or ultraviolet radiation.

Preferred compositions of this type, with which it is particularly advantageous to utilize the present invention, are based on natural or synthetic rubbery materials which are sensitized with organic solvent-soluble azides. Suitable rubbery materials include natural rubber, which is commonly known as sulfur vulcanizable rubber, oxidized rubbers, such as are described in Stevens et al U.S. Pat. No. 2,132,809, cyclized rubbers such as are described in Carson U.S. Pat. No. 2,371,736 and Osterhof U.S. Pat. No. 2,381,180, rubbery synthetic polymers and copolymers such as those prepared from 1,3-diolefins, e.g., 1,3-butadiene, isoprene, neoprene, etc., cyclized polyisoprene prepared, for example, as described in Journal of Polymer Science, Part A, Vol. 2, No. 9 pp. 3969–85 and 3987–4001 (1964), and copolymers of butadiene with various unsaturated compounds such as styrene, isobutylene, etc. Such synthetic copolymers are known commercially under tradenames such as Buna S, Buna N, Butyl, Pliolite, and the like.

The organic solvent-soluble azide sensitizers are arylazides and preferably are bisazides such as 4,4'-diazido-stilbene, p-phenylene-bisazide, 4,4'-diazidobenzophenone, 4,4'-diazidodiphenylmethane, 4,4'-diazidochalcone, 2,6-di-(4'-azidobenzal)cyclohexanone, 2,6-di-(4'-azidobenzal)-4-methyl cyclo-hexanone, and the like, although monoazides, such as p-azido-benzophenone, can be successfully employed.

Representative photosensitive compositions which can be modified in accordance with the present invention and which employ such organic solvent-soluble colloids and azides are described in such patents as Hepher et al U.S. Pat. No. 2,852,379, Sagura et al U.S. Pat. No. 2,940,853, Kodak British Patent No. 886,100, and Kodak British Patent No. 892,811.

The coating compositions can additionally contain other addenda known in the art and employed for their known purposes such as surfactants, coating aids, antioxidants, fungicide, bactericides, thickeners, and the like.

Photoresist images are prepared with the photosensitive compositions of this invention by first treating the support in accordance with usual practices, such as preparatory treatment of the surface with acids, cleaning agents, and the like to clean the surface and insure good adhesion of the resist thereto. With such treatments and with certain supports, the surface can be heated for a period of time sufficient to drive off any residual water or other liquid remaining from the cleaning operation. Next, the photoresist composition is coated on the support in accordance with conventional techniques referred to above. The coating thickness will depend upon the particular resist composition being employed, and the intended use of the resulting resist. Thickness in the range of 0.1 to 1 mils are suitable for most photoresist uses. The coated photosensitive element can be prebaked at a temperature in the range of 60° to 100° C for a period of time sufficient to remove the residual solvent. This prebaking also improves adhesion of the coating to the support to a certain extent and prevents removal of exposed areas of the coating during development. A photoresist image is prepared with the photosensitive element by imagewise exposing the element to a suitable source of actinic radiation to harden and insolubilize the composition in exposed areas. The image can then be developed by washing with a solvent for the unexposed unhardened material which is a nonsolvent for material in exposed areas to preferentially remove the polymer composition from the unexposed areas and leave a relief image of hardened polymer in the exposed areas. After the relief image is developed, adhesion of the resist to the support is improved by postbaking the element for from about 5 to 15 minutes at a temperature in the range of about 120° to 180° C. The polymeric relief pattern is then ready for use as a resist in accordance with conventional techniques known to those skilled in the art.

The following examples further illustrate the practice of the present invention.

Example 1 - Increased Adhesion with t-Butyl Hydroperoxide

A photoresist composition based on cyclized polyisoprene is prepared having the following compositions:

| | |
|---|---|
| Cyclized polyisoprene | 45 grams |
| Xylene | 255 milliliters |
| 2,6-Di-(4'-azidobenzal)-4-methyl cyclohexanone sensitizer | 1.5 grams |
| N-bromosuccinimide | 0.5 gram |

This photoresist solution is allowed to stand in the presence of air for at least two weeks and then is divided into three equal portions. One portion is left as is and used as a control; to the second portion is added 0.2 percent (0.03 gram) of t-butyl hydroperoxide; and to the third portion is added 0.8 percent (0.12 gram) of t-butyl hydroperoxide. Silicon wafers of about 8 mils thickness and about 3.0 cm diameter are prepared for coating by drying and heating to about 500° C for one hour. After cooling, individual ones of the wafers are coated under nitrogen, with one of the three resist compositions described above by whirling at about 6,000 rpm for 20 seconds or so. The rate and time of whirling is adjusted to provide a resist thickness after prebake of 1.0 micron. The coated wafers are then prebaked at 50° C for 10 minutes, cooled to room temperature and exposed to a pattern containing fine detail after which a resist image is developed by spraying with Stoddard's Solvent. After rinsing with distilled water, the resist images are postbaked for 10 minutes, some at 120° C, others at 140° C and yet others at 160° C. The wafers are then etched in buffered hydrofluoric acid solution, some at 25° C and some at 65° C, without agitation with the coated side up. The wafers are then rinsed in distilled water, dried, and examined. Table I below indicates the results of the examination and demonstrates the improved adhesion obtained with the resist compositions of this invention. In this Table, the length of time the resist withstands the action of the hydrofluoric acid etchant before failure occurs, is shown under the column Etch Resistance and the increase in width, in microns, of one side of a line is shown under the column Undercutting.

TABLE I

| Composition | Number of Pinholes per unit area[1] | etch resistance (Min.) 25°C | 65°C | undercutting (microns per side) 120°C | 140°C | 160°C |
|---|---|---|---|---|---|---|
| Control | 7 | 40 | 3–3½ | 1.01 | 1.11 | 1.99 |
| control+0.2% t-butyl hydroperoxide | 3 | 45 | 3½ | 1.8 | 1.4 | 1.7 |
| control+0.8% hydroperoxide | more than 15 | 45 | 4 | 0.96 | — | — |

The above invention has been described in detail with particular reference to preferred embodiments thereof, but it will be understood that variations and modifications can be effective within the spirit and scope of the invention.

What is claimed is:

1. A photo sensitive polymeric coating composition comprising:
 1. an organic solvent-soluble, light-sensitive arylazide sensitized film-forming rubbery material,
 2. a polar N-halo cyclic imide, and
 3. an organic solvent hydro peroxide which is thermally stable at temperatures up to 100° C.

2. A composition as defined in claim 1 wherein the N-substituted imide is an N-halo cyclic imide and the organic hydroperoxide is an alkyl hydroperoxide.

3. A composition as defined in claim 2 wherein the N-halo cyclic imide is selected from the group consisting of N-bromosuccinimide, N-iodoglutarimide, and N-bromophthalimide, and the alkyl hydroperoxide is t-butyl hydroperoxide.

4. A composition as defined in claim 1 wherein the organic hydroperoxide comprises up to 1 percent by weight of the rubbery material and the N-substituted imide comprises up to 10 percent by weight of the rubbery material.

5. A composition as defined in claim 1 wherein the light-sensitized, film-forming rubbery material is an aryl-azideisensitized natural rubber.

6. A composition as defined in claim 1 wherein the light-sensitized, film-forming rubbery material is an aryl-azide-sensitized synthetic rubber.

7. A composition as defined in claim 1 wherein the light-sensitized, film-forming rubbery material is an aryl-azide-sensitized cyclized polyisoprene.

8. A photosensitive polymeric coating composition comprising a solution in an organic solvent of 1. an organic solvent-soluble, film-forming, cyclized rubbery material sensitized with an organic solvent-soluble bisarylazide,
2. an N-halo cyclic imide selected from the group consisting of N-bromosuccinimide, N-iodoglutarimide, and N-bromophthalimide, the N-halo cyclic imide constituting about 0.5 to 3 percent by weight of the rubbery material, and
3. an alkyl hydroperoxide which is thermally stable at temperatures up to 100° C, constituting about 0.05 to 0.5 percent by weight of the rubbery materials.

9. A photosensitive polymeric coating composition comprising a solution in xylene of 1. an organic solvent-soluble, film-forming, cyclized polyisoprene sensitized with an organic solvent-soluble bisarylazide,
2. N-bromosuccinimide, constituting about 0.5 to 3 percent by weight of the cyclized polyisoprene, and
3. t-butyl hydroperoxide, constituting about 0.05 to 0.5 percent by weight of the cyclized polyisoprene.

* * * * *

UNITED STATES PATENT AND TRADEMARK OFFICE

CERTIFICATE OF CORRECTION

PATENT NO. : 3,711,287

DATED : January 16, 1973

INVENTOR(S) : Kenneth R. Dunham and Marshall E. Yost

It is certified that error appears in the above-identified patent and that said Letters Patent are hereby corrected as shown below:

Title page, 2nd column, 6th line from bottom, before "G.", --Joshua-- should be inserted. Column 6, line 48, "photo sensitive" should read --photosensitive--; line 53, "solvent hydro peroxide" should read --hydroperoxide--. Column 7, line 3, "aryl-azideisensitized" should read --arylazide-sensitized--.

Signed and Sealed this

*eighteenth* Day of *May 1976*

[SEAL]

*Attest:*

RUTH C. MASON
*Attesting Officer*

C. MARSHALL DANN
*Commissioner of Patents and Trademarks*